United States Patent
Kumada et al.

[11] Patent Number: 5,981,146
[45] Date of Patent: Nov. 9, 1999

[54] RESIST COATING FILM

[75] Inventors: Teruhiko Kumada; Atsuko Sasahara; Youko Tanaka; Hideo Horibe; Shigeru Kubota; Hiroshi Koezuka, all of Amagasaki; Tetsuro Hanawa, Itami, all of Japan

[73] Assignee: Mitsubishi Denki Kabushiki Kaisha, Tokyo, Japan

[21] Appl. No.: 08/789,560

[22] Filed: Jan. 28, 1997

Related U.S. Application Data

[63] Continuation of application No. 08/588,096, Jan. 18, 1996, abandoned, which is a continuation of application No. 08/065,759, May 24, 1993, abandoned.

[30] Foreign Application Priority Data

May 25, 1992 [JP] Japan ................................. 4-132242
Nov. 4, 1992 [JP] Japan ................................. 4-294851

[51] Int. Cl.[6] ................................................ G03C 1/73
[52] U.S. Cl. ........................................ 430/273.1; 430/921
[58] Field of Search ............................... 430/273.1, 325, 430/921

[56] References Cited

U.S. PATENT DOCUMENTS

| | | | |
|---|---|---|---|
| 4,200,463 | 4/1980 | Flowers | 430/317 |
| 4,461,825 | 7/1984 | Kato et al. | 430/273 |
| 4,842,990 | 6/1989 | Herrmann et al. | 430/272 |
| 4,988,607 | 1/1991 | Ali | 430/273.1 |
| 5,198,326 | 3/1993 | Hashimoto et al. | 430/325 |
| 5,240,812 | 8/1993 | Conley et al. | 430/273 |
| 5,326,675 | 7/1994 | Niki et al. | 430/273 |
| 5,750,312 | 5/1998 | Chandross et al. | 430/173.1 |

FOREIGN PATENT DOCUMENTS

| | | |
|---|---|---|
| 4133770 | 4/1992 | Germany . |
| 63-287950 | 11/1988 | Japan . |
| 4-204848 | 7/1992 | Japan . |
| 63-287950 | 4/1995 | Japan . |

OTHER PUBLICATIONS

MacDonald et al., "Airborne Chemical Contamination Of A Chemically Amplified Resist", SPIE vol. 1466 Advances in Resist Technology and Processing 1991, pp. 2–12.

Neenan et al. "Chemically Amplified Resists: A Lithographic Comparison Of Acid Generating Species", SPIE vol. 1086 Advances In Resist Technology And Processing V1 (1989), pp. 2–10.

*Primary Examiner*—Maria Nuzzolillo
*Assistant Examiner*—Laura Weiner
*Attorney, Agent, or Firm*—Leydig, Voit & Mayer, Ltd.

[57] ABSTRACT

When a fine pattern is formed by using a chemical-amplification-type resist film, fall of acid in the surface of the resist can be inhibited so that a fine pattern exhibiting an excellent shape is formed. A resist coating film containing a compound having a sulfonic acid group or a carbonic acid group is formed on a chemical-amplification-type resist film of a semiconductor substrate, followed by performing exposure.

5 Claims, 8 Drawing Sheets

RESIST COATING FILM

This disclosure is a continuation of patent application Ser. No. 08/588,096, filed Jan. 18, 1996, now abandoned, which is a continuation of patent application Ser. No. 08/065,759, filed May 24, 1993, now abandoned.

BACKGROUND OF THE INVENTION

1. Field of the Invention

The present invention relates to a resist coating film for use at the time of forming a fine pattern of a semiconductor device, and to a pattern forming method and a semiconductor device.

2. Description of the Related Art

In the recent tendency of desiring highly integrated semiconductor devices, micro-processing technology has been improved. In order to realize the foregoing technology, some means have been investigated. Among the foregoing means, exposure technology has attracted attention, the technology using an excimer laser as the exposure light source to shorten the wavelength of the light source for use in the photolithography technology. Another exposure technology using, as the exposure light source, electron beams or X-rays, with which problems of optical interference can be ignored, has attracted attention.

With the tendency of shortening the wavelength of the exposure light source, there arise problems of nonconformance of photosensitive wavelength with respect to a resist and unsatisfactory transmittance of the resist with respect to the short wavelength. As a result, improvement in resolution has been difficult. In order to overcome the foregoing problems, use of a resist utilizing a chemical amplification mechanism has been investigated. As disclosed in Japanese Patent Laid-Open No. 59-45439, a high resolution pattern can be obtained by using a resist composition containing: a polymer of a type in which a water-soluble functional group of a resin exhibiting high transparency with respect to far ultraviolet rays is substituted by a group which is unstable with respect to acids; and a compound that generates acids due to irradiation with ultraviolet rays.

The lithography technology using far ultraviolet rays, such as excimer laser beams, employs a three-component chemical amplification positive-type resist composed of: an acid generating agent which is decomposed due to a photochemical reaction to generate acids; a base resin having a group which does not considerably absorb far ultraviolet rays and which is decomposed due to an acid-catalyst reaction, to improve the solubility thereof; and a dissolution inhibitor or a two-component chemical amplification positive-type resist that does not contain the dissolution inhibitor.

FIGS. 5A to 5D illustrate an example of the chemical amplification positive-type resist. FIG. 5A illustrates a structural formula of the base resin, FIG. 5B illustrates that of the dissolution inhibitor for inhibiting the solution of the base resin in an alkali developer, and FIG. 5C illustrates that of the acid generator.

As an example of poly-p-hydroxystyrene derivative for use as the base resin, poly-p-hydroxystyrene that has been made partially esterified with a tertiary butoxy carbonyl group (hereinafter called "t-Boc") is exemplified. Referring to the drawing, n is a natural number denoting the degree of polymerization, x is a number which is zero or more and as well as less than 1 and which denotes the ratio made to be t-Boc. Specifically n is a value from 0.1 to 0.5 (see FIG. 5A).

As an example of the dissolution inhibitor, the general formula of bis phenol A-type is shown. Referring to the drawing, R is an alkyl group (see FIG. 5B). In FIG. 5C, which illustrates an example of the acid generating agent, $^-$B is the paired anion of a triallylsulfonium cation, the structure of which is shown in FIG. 5D. Symbol M is a metal element such as arsenic or antimony, X is a halogen element, and subscript n is the acid digit of the metal element.

The method of forming a conventional resist pattern will now be described with reference to the drawings. FIGS. 6A to 6D are cross sectional views which illustrate the conventional method of forming a resist pattern by using a chemical amplification positive-type resist and utilizing excimer laser beam irradiation, the method being illustrated in the sequential order of the process.

First, a chemical amplification positive-type resist film 2 is, after spin coating has been performed, formed on a semiconductor substrate 1 to have a thickness of about 1.0 to 1.5 μm by soft baking performed at about 80° C. to 130° C. (see FIG. 6A).

Then, the resist film 2 is selectively irradiated with excimer laser beams 3 from a position above the semiconductor substrate 1 through a reticle 4 so that proton acid 5 is generated, the proton acid 5 catalyzing a de-t-Boc reaction of the base resin, which has been made partial t-Boc, and the dissolution inhibitor (see FIG. 6B).

Thereafter, the semiconductor substrate 1 is heated by baking at about 60° C. to 100° C. for 1 to 2 minutes so that a portion 6 of the resist film 2 irradiated with excimer laser beams 3 is caused to de-t-Boc-react selectively the base resin and the dissolution inhibitor due to the acid catalyst. As a result, the solubility with respect to the alkali developer is improved (see FIG. 6C).

Then, the portion 6 of the resist film 2 irradiated with excimer laser beams 3 is eluted by a developing fluid such as water-soluble alkali solution having a proper concentration so that a resist pattern 7 is formed (see FIG. 6D).

FIGS. 7A and 7B illustrate the de-t-Boc reactions of the base resin and the dissolution inhibitor due to the acid catalyst taking place in the portion 6 of the resist film 2 irradiated with excimer laser beams 3 in the process shown in FIG. 6C. FIGS. 7A and 7B, respectively, illustrate the de-t-Boc reactions of the dissolution inhibitor and the base resin caused by acid HX generated due to the irradiation of the excimer laser beams 3.

FIG. 8 shows the improvement in the solubility of the exposed portion of the chemical amplification positive-type resist with respect to the alkali developer due to the foregoing de-t-Boc reaction. FIG. 8 is a graph which shows the difference in the solubility between a non-exposed portion of the chemical amplification positive-type resist and the exposed portion of the same with respect to the alkali developer.

Since the formation of the fine pattern by using the conventional chemical-amplification-type resist is performed as described above, high sensitivity and high resolution can be realized. However, the acid or its precursor generated due to the exposure reacts with oxygen in air and basic compounds present in the atmosphere and loses its activity in the surface of the resist film that is in contact with the atmosphere. In particular, the foregoing tendency becomes excessive if a long time passes from the exposure process to the ensuing heating process.

FIGS. 9A to 9C are graphs which illustrate the state in the surface portion of the resist film. FIG. 9A illustrates the change in the concentration of the acid, FIG. 9B illustrates the change in the solubility with respect to the alkali developer and FIG. 9C is a cross sectional view of the resist pattern.

As shown in FIG. 9A, the concentration of the acid falls in a portion from the surface of the resist film designated by symbols Δx. As a result, a reaction of decomposing a non-polar group or a reaction of a cross linking agent does not take place effectively in the heating process to be performed after the exposure has been performed. Hence, the sensitivity excessively deteriorates and the solubility with respect to the alkali developer is excessively lowered in the surface portion of the resist film as shown in FIG. 9B. Therefore, a layer which cannot be dissolved easily and which has the thickness Δx is formed in the surface of the resist film. As a result, there arises a problem that the resist pattern 7, which is formed into an accurate rectangle and the dimensions of which can be controlled satisfactorily, cannot be formed. Therefore, although the chemical-amplification-type resists are employed only to manufacture prototypes of semiconductor devices or to perform experiments, it cannot be employed in mass production.

SUMMARY OF THE INVENTION

In order to overcome the foregoing problems, an object of the present invention is to prevent a decrease in the concentration of acid in the surface of a resist film after exposure has been performed when a pattern is formed by using a chemical-amplification-type resist so as to form a fine stable resist pattern exhibiting an excellent shape.

In order to achieve the above object, according to one aspect of the present invention, there is provided a method of forming a pattern on a semiconductor substrate comprising steps of: forming a chemical-amplification-type resist film on a semiconductor substrate; forming a resist coating film on the chemical-amplification-type resist film; and applying light or radial rays for exposing to form a predetermined pattern from a position above the resist coating film.

According to another aspect of the present invention, there is provided a resist coating film comprising an improvement in that the resist coating film is formed on a chemical-amplification-type resist film prior to performing exposure to inhibit contact between the exposed resist film with the atmosphere.

The pattern forming method according to the present invention has an arrangement in which the resist coating film is formed on the chemical-amplification-type resist film. Therefore, the surface of the resist film is not exposed to the atmosphere and, accordingly, reactions of acid or its precursor generated due to the exposure to oxygen and the basic compounds in the atmosphere can be prevented. As a result, a decrease in the concentration of acid in the surface portion of the resist film can be prevented. In particular, if the material of the resist coating film contains a compound having a sulfonic acid group or a carboxylic acid group, the sulfonic acid or the carboxylic acid contained in the resist coating film supplies acid to the surface portion of the resist film formed under the resist coating film. Also in a case where the material of the resist coating film contains a compound that generates acid when the compound is irradiated with light or radial rays, acid is generated in the resist coating film as well as in the resist film due to the exposure. Therefore, acid in the resist coating film is supplied to the surface of the resist film formed under the resist coating film. As a result, the concentration of acid in the surface portion of the resist film is the total of the concentration of the acid generated in the resist film due to the exposure and that of the acid supplied from the resist coating film. Hence, if a long time takes from the exposure process to the ensuing heating process, a decrease in the acid in the surface portion of the resist film is inhibited. As a result, reactions in the heating process can be allowed to proceed effectively. It leads to the fact that formation of a layer that cannot easily be dissolved with respect to an alkali developer in the surface of the resist film can be prevented and, accordingly, a pattern exhibiting a high resolution and having an excellent shape can be formed stably.

By determining the thickness of the resist coating film to be a predetermined value, the resolution of the base resist film can be maintained and fall of the concentration of the acid in the surface portion of the resist film can be inhibited effectively.

By further adjusting the composition ratio of the material of the resist coating film to a predetermined value, the concentration of the sulfonic acid group or the carboxylic acid group or the content of the compound that generates acid by light or radial rays can be maintained. Therefore, a decrease in the concentration of the acid in the surface portion of the resist film can be prevented effectively.

Even if the resist film and the resist coating film are made of materials that are mixed with each other, formation of an organic film that is not mixed with the foregoing materials between the resist film and the resist coating film enables a similar effect to be obtained.

Further, a semiconductor apparatus manufactured due to the pattern formation by using a resist coating film of the foregoing type exhibits excellent dimension accuracy and satisfactory reliability.

DESCRIPTION OF THE PREFERRED EMBODIMENTS

Example 1

An example of the present invention will now be described.

FIGS. 1A to 1E are cross sectional views which illustrate Example 1 of a method of forming a resist pattern by using the chemical amplification positive-type resist and utilizing excimer laser beam irradiation, the method being illustrated in the sequential order of the process.

First, a chemical amplification positive-type resist film 2 is, after spin coating has been performed, formed on a semiconductor substrate 1 to have a thickness of about 1.0 to 1.5 $\mu$m by soft baking performed at about 80° C. to 130° C. (see FIG. 1A).

Figure 1A:
FIGS. 1A to 1E are cross sectional views which illustrate a method of forming a pattern according to Example 1 of the present invention.
Figure 1B:
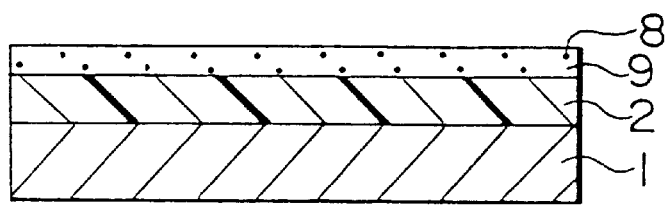

Then, a resist coating film 9 is formed on the resist film 2 by spin coating, the resist coating film 9 being made of, for example, polyvinyl alcohol containing organic acid 8 such as benzoic acid, phthalic acid, benzene sulfonic acid or toluene sulfonic acid that cannot easily be dispersed so that the resist coating film 9 does not considerably absorb far ultraviolet rays and the resist coating film 9 can easily be removed at the time of development (see FIG. 1B).

Figure 1C:
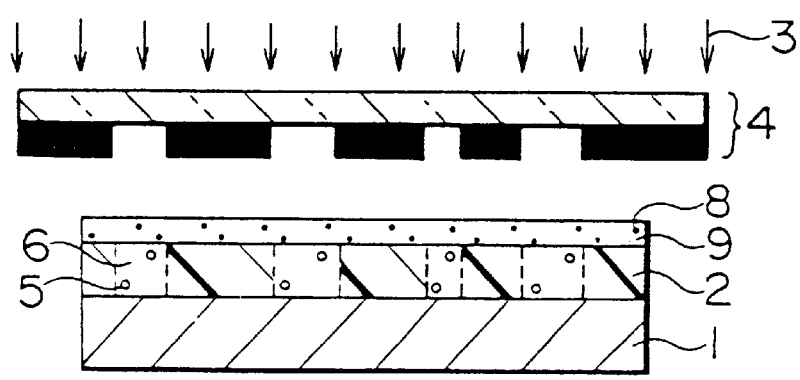
Figure 1D:
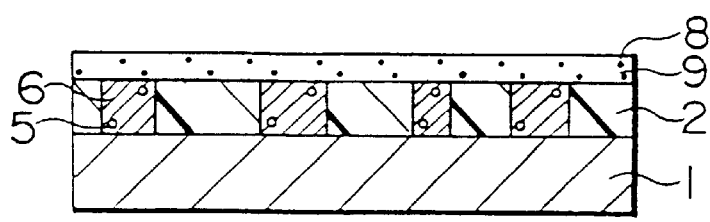
Figure 1E:
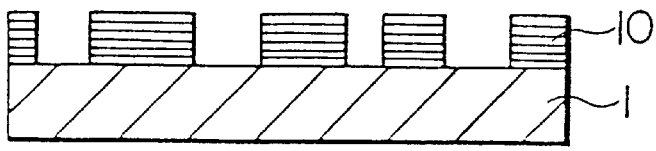

Then, the resist film 2 is irradiated with excimer laser beams 3 from a position above the resist coating film 9 through a reticle 4 so that proton acid 5 is generated, the proton acid 5 catalyzing the de-t-Boc reaction of the base resin, which has been made partial t-Boc, and the dissolution inhibitor (see FIG. 1C).

Then, the semiconductor substrate 1 is heated by baking at about 60° C. to 100° C. for 1 to 2 minutes so that a portion 6 of the resist film 2 irradiated with excimer laser beams 3 is caused to de-t-Boc-react selectively the base resin and the dissolution inhibitor due to the acid catalyst. As a result, the solubility with respect to the alkali developer is improved (see FIG. 1D).

Then, the portion 6 of the resist film 2 irradiated with excimer laser beams 3 and the resist coating film 9 are eluted by a developing fluid such as water-soluble alkali solution having a proper concentration. As an alternative to this, only the resist coating film 9 is eluted by rinsing with pure water, followed by drying, and then the resist film 2 is eluted by the developer. Thus, a resist pattern 10 is formed (see FIG. 1E).

Figure 2A:
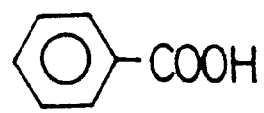
FIGS. 2A to 2E illustrate the structural formulas of component materials of a resist coating film for use to form the pattern according to Example 1 of the present invention.
Figure 2B:
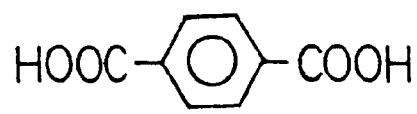
Figure 2C:
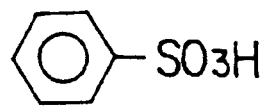
Figure 2D:
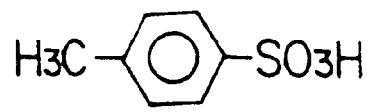
Figure 2E:
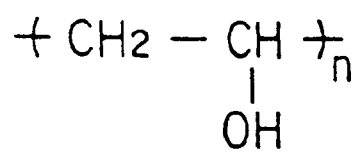

In the foregoing example, the resist coating film is made of polyvinyl alcohol containing the organic acid 8 such as benzoic acid, phthalic acid, benzene sulfonic acid or toluene sulfonic acid. The constituted structures are shown in FIGS. 2A to 2E. FIGS. 2A to 2D, respectively, illustrate the structural formulas of benzoic acid, phthalic acid, benzene sulfonic acid or toluene sulfonic acid. FIG. 2E illustrates the structural formula of polyvinyl alcohol. Referring to FIG. 2E, n denotes the degree of polymerization.

The concentration of the organic acid 8 can be varied in accordance with the degree of the formation of the layer in the surface of the resist film 2 that cannot easily be dissolved, the degree mainly depending upon the atmosphere in the clean room.

Then, the inhibition of the decrease in the concentration of the acid realized by the resist coating film 9 in this example will now be described.

Figure 3A:
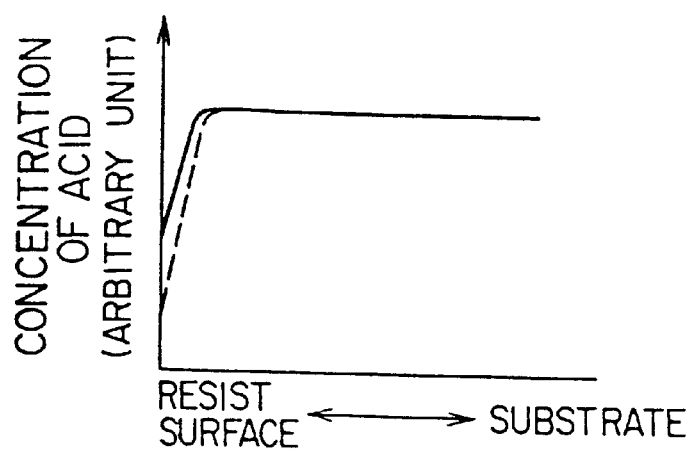
FIGS. 3A to 3C are graphs which illustrate the distributions of acid in the resist film according to Example 1 of the present invention.
Figure 3B:
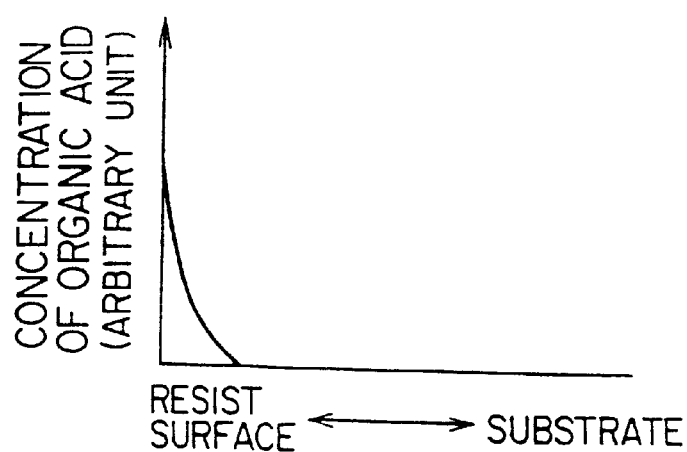
Figure 3C:
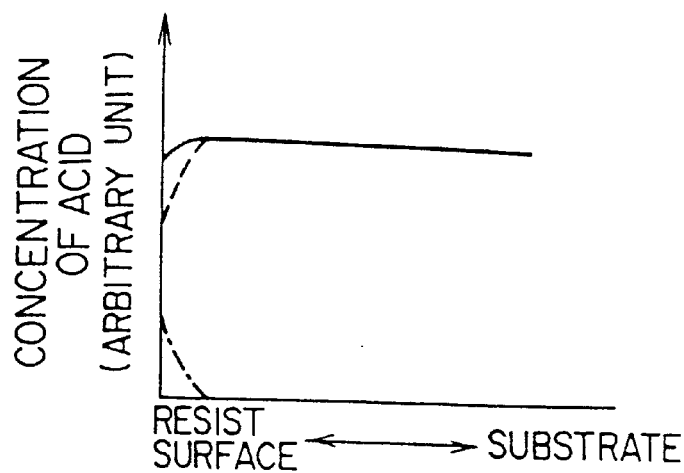

FIGS. 3A to 3C illustrate the distribution of the acid concentration in the resist film 2, the distribution being realized in a direction perpendicular to the semiconductor substrate 1. FIG. 3A illustrates shielding of the resist film 2 from the atmosphere enabling the fall of the density of the acid generated due to the exposure to be inhibited. The continuous line of FIG. 3A shows the concentration distribution in the resist film 2 realized when the resist coating film 9 that does not contain the organic acid 8 is formed, while a dashed line shows the same realized when no resist coating film 9 is formed. FIG. 3B illustrates the distribution of the acid concentration in the resist film 2 when the resist coating film 9 that contains the organic acid 8 is formed.

By forming the film on the resist film 2 as shown in FIG. 3A to shield the resist film 2 from the atmosphere, the reaction of the acid 5 generated due to the exposure with oxygen and the basic compounds in the atmosphere is prevented. As a result, the fall of the concentration of the acid in the surface of the resist film 2 is inhibited. Further, the organic acid 8 contained in the resist coating film 9 is supplied to the surface of the resist film 2 as shown in FIG. 3B.

By forming the resist coating film 9, the foregoing two effects can be obtained so that the decrease in the acid in the surface of the resist film 2 is inhibited as shown in FIG. 3C. Referring to FIG. 3C, a dashed line shows the effect of FIG. 3A, an alternate-long and short-dash line shows the effect of FIG. 3B and a continuous line shows the combination of the two effects.

Example 2

Example 2 of the present invention will now be described.

First, a chemical-amplification-type resist film 2 is formed on the semiconductor substrate 1 by a spin coating method to have a thickness of about 1 $\mu$m, the chemical-amplification-type resist film 2 being made of poly-tert-butoxycarbonyl oxystyrene and triphenylsulfonium hexafluoroantimonate. Then, a resist coating film 9 made of polystyrene sulfonic acid is formed on the resist film 2 by the spin coating method to have a thickness of about 0.10 $\mu$m. The resist coating film 9 is irradiated with KrF excimer laser beams while interposing a mask pattern, and then the semiconductor substrate 1 is heated at about 100° C. for 60 seconds. Then, the resist coating film 9 is removed with pure water, followed by developing for about 70 seconds with 2.38% tetramethylammonium hydroxide water solution. As a result, a resist pattern 10 is formed.

Example 2 enables the resist film 2 to exhibit sensitivity of a light irradiation quantity of 5 mJ/cm$^2$. When it is irradiated with excimer laser beams of 8 mJ/cm$^2$, a line-and-space pattern exhibiting an excellent shape was formed.

If no resist coating film 9 was formed and the residual conditions were the same in Example 2, the same resolution as that realized when the resist coating film 9 was formed was realized when the heating process was performed immediately after the exposure. However, patterns smaller than 0.5 $\mu$m could not be resolved when heating was performed after 30 minutes had passed from the exposure.

Figure 4A:
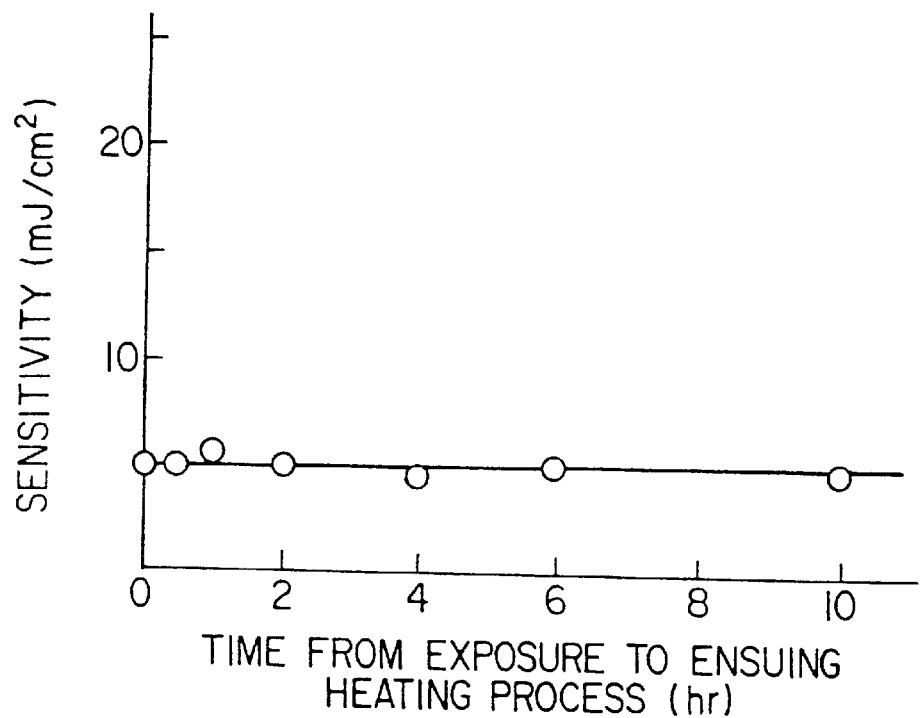
FIGS. 4A and 4B are graphs which illustrate changes in sensitivity in the resist film according to Example 2 of the present invention.
Figure 4B:
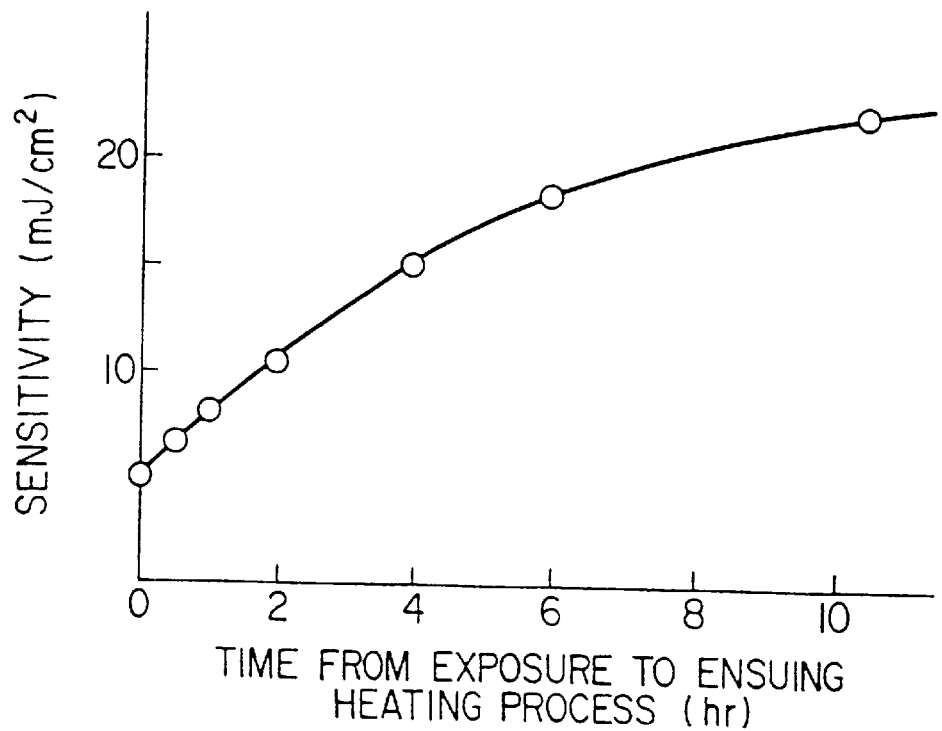
Figure 5A:
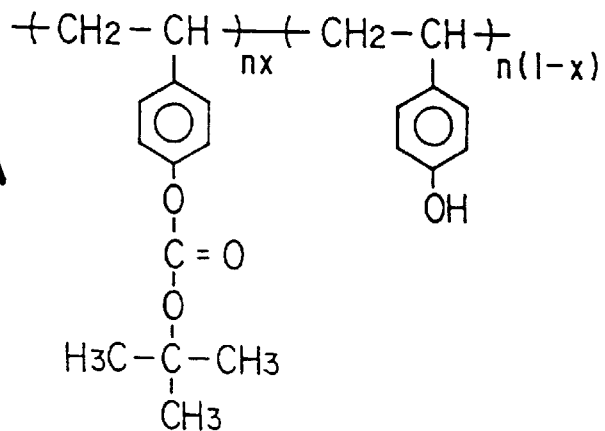
FIGS. 5A to 5D illustrate structural formulas of materials of a three-component-type chemical-amplification positive-type resist.
Figure 5B:
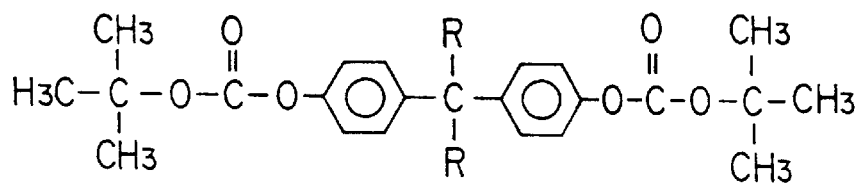
Figure 5C:
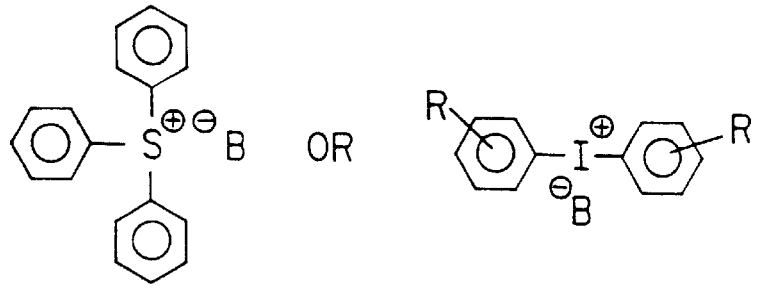
Figure 5D:
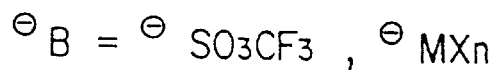
Figure 6A:
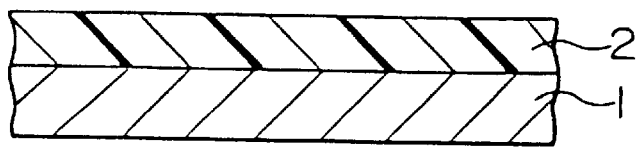
FIGS. 6A to 6D are cross sectional views which illustrate a conventional method of forming a pattern.
Figure 6B:
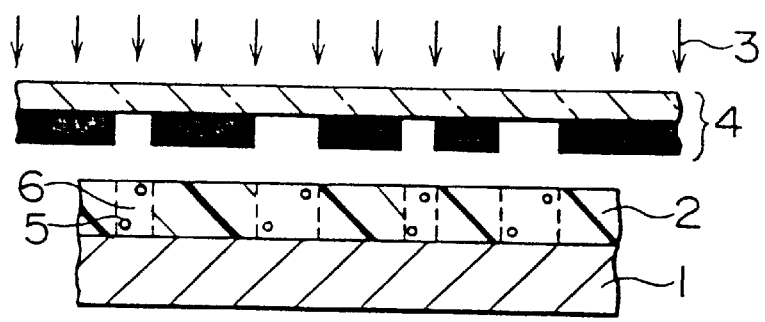
Figure 6C:
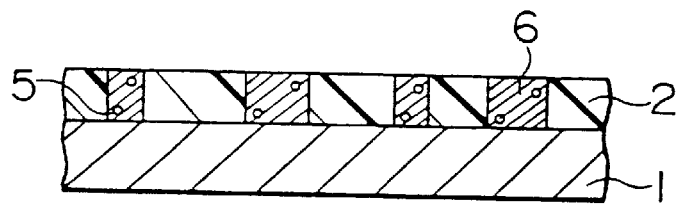
Figure 6D:
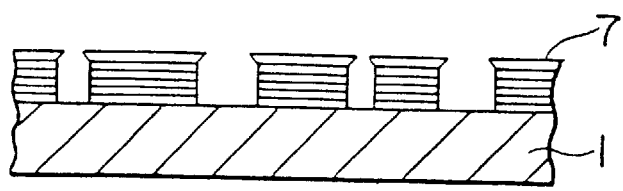
Figure 7A:
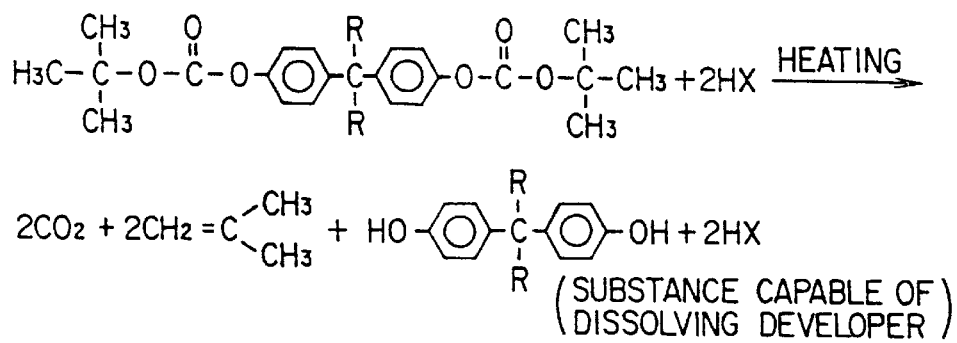
FIGS. 7A and 7B illustrate reaction formulas of a de-t-Boc reaction of an acid catalyst taken in the three-component-type chemical-amplification positive-type resist.
Figure 7B:
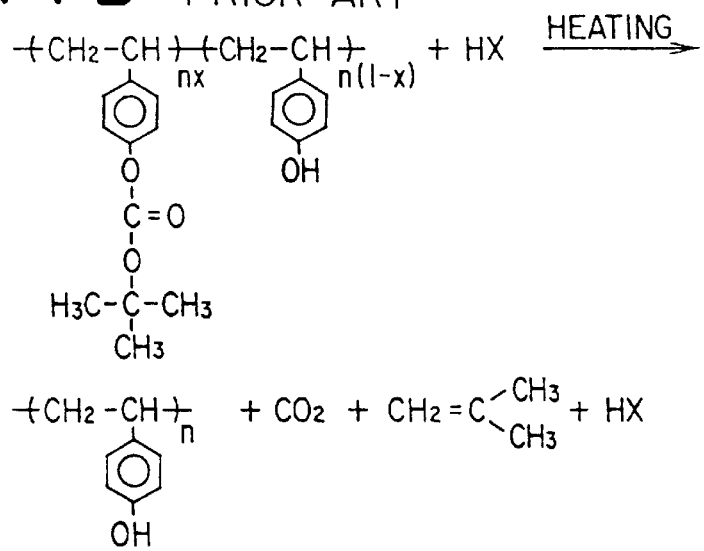
Figure 8:
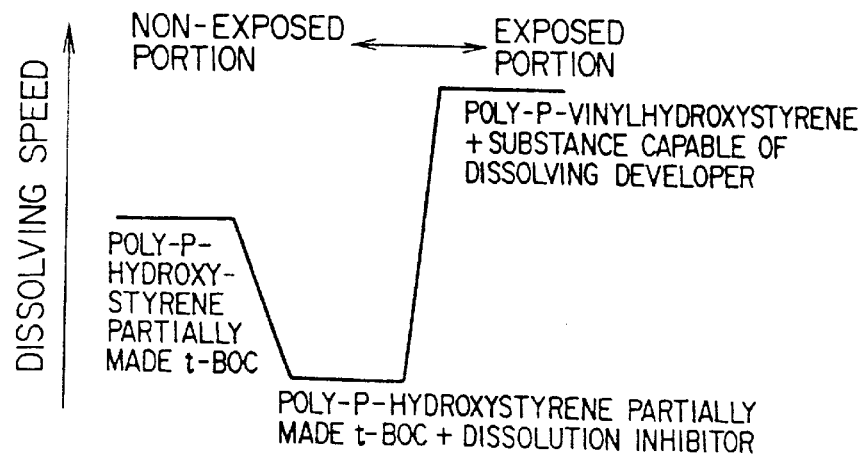
FIG. 8 is a graph which illustrates change in solubility of the three-component-type chemical-amplification positive-type resist.
Figure 9A:
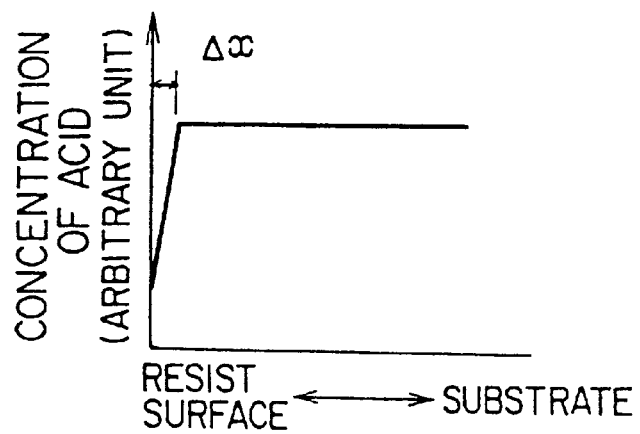
FIGS. 9A to 9C are graphs which illustrate changes in the acid concentration in the surface of the resist film, the solubility and the pattern.
Figure 9B:
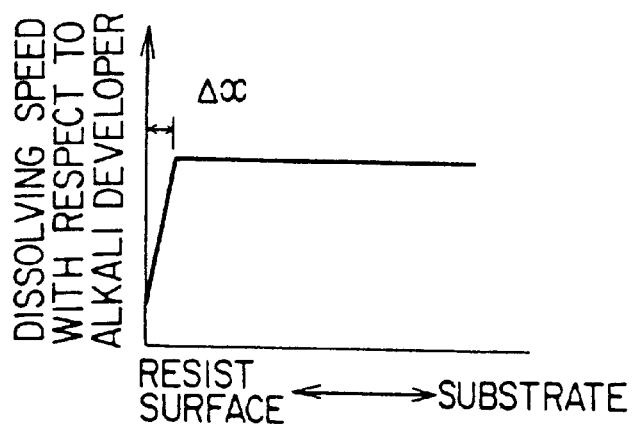
Figure 9C:
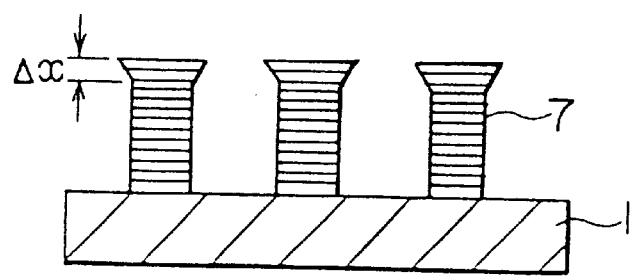

FIGS. 4A to 4B show change in the sensitivity (quantity of light to obtain a predetermined effect of development) when the time taken from the irradiation with the excimer laser beams to performing the heating process was changed. FIG. 4A shows the result of Example 2, while FIG. 4B shows the result realized when no resist coating film 9 was formed and the residual conditions were the same as those of Example 2. As shown in the graphs, the conventional method having no resist coating film 9 resulted in the quantity of light denoting the sensitivity increasing with the time taken from the exposure to performing the heating process, that is the sensitivity deteriorated.

However, Example 2 resulted in no deterioration in the sensitivity.

Example 3

Example 3 of the present invention will now be described.

First, a chemical-amplification-type resist film 2 similar to Example 2 was formed on the semiconductor substrate 1, and then a resist coating film 9 composed of 90 parts by weight of polyvinyl alcohol and 10 parts by weight of para-toluene sulfonic acid was applied to have a thickness of about 0.10 $\mu$m. Then, electron beams were applied from a position above the semiconductor substrate 1 with the accelerated voltage of about 20 KeV, followed by heating the semiconductor substrate 1 at about 100° C. for two minutes. Then, the resist coating film 9 was removed with pure water, and then development was performed for about 70 seconds with 2.38% tetramethylammonium hydroxide water solution so that a resist pattern is formed.

As a result of Example 3, the resist film 2 had a sensitivity of 0.8 $\mu$C/cm$^2$ and a 0.2 $\mu$m line-and-space pattern exhibiting an excellent shape was formed when the resist film 2 was irradiated with electron beams of 1.2 $\mu$C/cm$^2$.

When the resist coating film 9 was composed of only polyvinyl alcohol and the residual conditions were the same as those of Example 3, the sensitivity and the resolution were the same as those obtainable in Example 3 in the case where the heating process was performed immediately after electron beams were applied to form the pattern. If the time taken from the irradiation with electron beams to performing the heating process was longer than 12 hours, the sensitivity gradually deteriorated, resulting in deterioration in the sensitivity to 3 $\mu$C/cm$^2$ after 20 hours had passed. However, Example 3 resulted in on decrease in sensitivity even if 20 hours had passed from the irradiation with electron beams.

The material of the resist coating film 9 will now be described.

A first compound containing a sulfonic acid group or a carboxylic acid group may have the sulfonic acid group or the carboxylic group in the side chain of a high polymer thereof or may have the same therein while mixing the same together with a high polymer serving as a binder. A high polymer is commonly defined as an organic macromolecule having a molecular weight ranging from about 5000 into the millions. A low polymer is a polymer having comparatively few monomer units and a molecular weight from about 300 to 5,000. The dividing line between low and high polymers is in the neighborhood of 5,000 to 6,000 molecular weight. (*The Condensed Chemical Dictionary*, 10th Edition, Van Nostrand Reinhold Company, New York, pages 834–835 (1981)).

A monomer for forming the high polymer having the sulfonic acid group or the carboxylic group in the side chain thereof is exemplified by a monomer containing a sulfonic acid group or a carboxylic acid group such as vinylsulfonic acid, allylsulfonic acid, methallylsulfonic acid, styrenesulfonic acid, methacrylic acid, styrenecarboxylic acid or maleic acid; and a compound formed by combining any one of acrylic acid, methacrylic acid, acrylic amide, vinyl alcohol, vinyl phenol and vinyl aniline with a compound having sulfonic acid. The sulfonic acid group or the carboxylic acid group does not need to contain all of the monomers that form the high polymer. The foregoing monomer may be copolymerized with a monomer such as methacrylic acid ester, acrylic acid ester or styrene. As for the copolymerization ratio, it is preferable that the molar fraction of the monomer having the sulfonic acid group or the carboxylic acid group is from 20% to 100%. If it is 20% or less, the concentration of the sulfonic acid group or the carboxylic acid group falls and, accordingly, desired characteristics cannot easily be obtained.

The first compound for use in making the resist coating film 9 according to the present invention may be made of a high polymer formed by an aromatic ring compound such as benzene, pyridine, thiophene, furan, pyrrole or imidazole as well as the foregoing first compound having the high polymer main chain formed by an alkyl chain. The sulfonic acid group or the carboxylic acid group may be bonded directly or while interposing an alkyl chain or the like, be bonded to the foregoing skeleton. Also in this case, all of the aromatic rings do not need to have the sulfonic acid group or the carboxylic acid group. It is necessary that 30% or more portion of the aromatic rings forming the polymer have the sulfonic acid group or the carboxylic acid group. If the portion is less than 30%, desired characteristics cannot easily be obtained because of the same reason.

In the case where the first compound having the sulfonic acid group or the carboxylic acid group is present together with the high polymer compound serving as the binder in the compound, the high polymer serving as the binder is exemplified by: starch such as polyvinyl alcohol, polyvinyl pyrolidone or cellulose; a water soluble high polymer such as polyethylene glycol, gelatin, polyacrylic acid, polymethacrylic acid, polymaleic acid or polyacrylic amide or their derivatives; and an organic-solvent soluble polymer such as methacrylic acid ester, acrylic acid ester, styrene, polycarbonate or polyester or their derivatives.

The first compound having the sulfonic acid group or the carboxylic acid group to be mixed in the foregoing material is exemplified by alkane sulfonic acid having 1 to 10 carbon atoms, halogenated alkane sulfonic acid having 1 to 5 carbon atoms, alkane disulfonic acid having 2 to 10 carbon atoms, alkane carboxylic acid having 1 to 10 carbon atoms, halogenated alkane carboxylic acid having 1 to 5 carbon atoms, alkane dicarboxylic acid having 2 to 10 carbon atoms, benzenesulfonic acid, halogenated benzenesulfonic acid, alkylbenzene sulfonic acid having 1 to 15 carbon atoms, benzoic acid, alkylbenzene carboxylic acid having 1 to 15 carbon atoms, benzenedisulfonic acid, benzenedicarboxylic acid, benzenetricarbonic acid and benzenetetracarboxylic acid.

Table 1 shows the results of experiments to evaluate the sensitivity and the resolution by using samples of the resist coating film 9 respectively made of 17 kinds of materials similar to Examples 1 to 3. With each material, a fine pattern having an excellent shape was resolved and no sensitivity change was observed even if a long time had passed from the irradiation with radial rays to performing the heating process.

TABLE 1

| No. | Material of Coating Film | Exposure Light Source | Sensitivity | Resolution |
|---|---|---|---|---|
| 1 | Polyvinylsulfonic acid | Excimer laser | 5 mJ/cm$^2$ | 0.30 μm |
| 2 | Polymethacrylsulfonic acid | Excimer laser | 5 mJ/cm$^2$ | 0.30 μm |
| 3 | Poly (2-acrylamide 2-methylpropane sulfonic acid) | Electron beam | 0.8 μC/cm$^2$ | 0.20 μm |
| 4 | Polymethacrylic acid | Excimer laser | 6 mJ/cm$^2$ | 0.30 μm |
| 5 | Poly (maleic acid-CO-isobutene) | Excimer laser | 5 mJ/cm$^2$ | 0.30 μm |
| 6 | Polyvinyl benzoic acid | Excimer laser | 8 mJ/cm$^2$ | 0.30 μm |
| 7 | Poly (vinylphenol-CO-vinylphenoxybutane sulfonic acid) | Excimer laser | 7 mJ/cm$^2$ | 0.30 μm |
| 8 | Poly (3-butanesulfonic acid thiophene) | Electron beam | 0.6 μC/cm$^2$ | 0.15 μm |
| 9 | Polyvinylalcohol + Benzene sulfonic acid (9:1) | Excimer laser | 5 mJ/cm$^2$ | 0.30 μm |
| 10 | Polyvinylpyrolidone + Benzene tricarboxylic acid (8:2) | Excimer laser | 7 mJ/cm$^2$ | 0.35 μm |
| 11 | Cellulose + Pentafluorobenzene carboxylic acid (9:1) | Excimer laser | 6 mJ/cm$^2$ | 0.30 μm |
| 12 | Polyacrylic acid + Pentafluoroethane sulfonic acid (8:2) | Excimer laser | 6 mJ/cm$^2$ | 0.30 μm |
| 13 | Polymethacrylic acid methyl + adipic acid (8:2) | Electron beam | 1.0 μC/cm$^2$ | 0.30 μm |
| 14 | Polyacrylic acid | Excimer laser | 5 mJ/cm$^2$ | 0.30 μm |
| 15 | Polyacrylic acid + poly (2-acryladido-2-methylpropane sulfonic acid) (9:1) | Excimer laser | 6 mJ/cm$^2$ | 0.30 μm |
| 16 | Polyacrylic acid + 4-phenolsulfonic acid (9.5:0.5) | Excimer laser | 6 mJ/cm$^2$ | 0.30 μm |
| 17 | Polyacrylic acid + 4-dodecyl benzene sulfonic acid (9:1) | Excimer laser | 7 mJ/cm$^2$ | 0.30 μm |

Example 4

Example 4 of the present invention will now be described in which a resist coating film 9 is used to form the pattern, the resist coating film 9 containing a compound that generates acid when the compound is irradiated with light or radial rays.

First, a chemical amplification positive-type resist film 2 was formed on a semiconductor substrate 1 by a spin coating method to have a thickness of 1 μm, the chemical amplification positive-type resist film 2 being composed of poly-tert-butoxycarbonyloxystyrene and triphenylsulfonium hexafluoroantimonate. Then, the resist coating film 9 containing a compound that generates acid when irradiated with light or radial rays was formed to have a thickness of 0.10 μm, the compound being formed by adding 10 parts by weight of diphenyliodonium trifluorosulfonate to 90 parts by weight of polyacrylic acid. The resist coating film 9 was irradiated with a KrF excimer laser while interposing a mask pattern, followed by heating with a hot plate at 100° C. for 60 seconds. Then, the resist coating film 9 was removed with pure water, and then development was performed for 70 seconds by using 2.38% tetramethylammonium hydroxide water solution.

The resist film 2 according to Example 4 had a sensitivity equivalent to a light irradiation quantity of 8 mJ/cm$^2$ and a line-and-space pattern exhibiting an excellent shape was formed when the resist film 2 was irradiated with an excimer laser of 15 mJ/cm$^2$. When the time taken from the step of irradiation with the excimer lazer beams to performing the heating process was varied to 10 hours, no sensitivity change was observed similar to Example 2.

If no resist coating film 9 was formed and the residual conditions were the same in Example 4, a 0.3 μm line-and-space pattern could be resolved in the case where the pattern was formed by heating the resist coating film 9 immediately after the irradiation with the excimer laser. However, patterns smaller than 0.5 μm could not be resolved when heating was performed after 30 minutes had passed from the exposure. The sensitivity of the resist film 2 deteriorated with time, similar to the case shown in FIG. 4B when the time taken from the step of irradiation with light to performing the heating process was changed similar to Example 2.

The inhibition of the fall of the concentration of acid due to the presence of the resist coating film 9 according to Example 4 will now be described.

If exposure is performed after the resist coating film 9 has been formed on the resist film 2, acid is generated in both resist film 2 and the resist coating film 9. Since the surface of the resist film 2 is shielded from the atmosphere by the resist coating film 9 formed on the resist film 2, it is not affected by oxygen or basic compounds in the atmosphere. Therefore, the fall of the concentration of the acid is inhibited as shown in FIG. 3A. The acid generated in the resist coating film 9 acts similarly to the organic acid 8 contained in the resist coating film 9 according to the foregoing Examples 1 to 3. That is, the acid contained in the resist coating film 9 is, as shown in FIG. 3B, diffused in the vicinity of the surface of the resist film 2 formed under the resist coating film 9. As a result of the foregoing two effects, the fall of the concentration of the acid present in the vicinity of the surface of the resist film 2 can be further inhibited as shown in FIG. 3C as described in Example 1. Since the acid is generated in only the exposed portions of the resist coating film 9 in Example 4, adverse effects of unnecessary acid can be prevented and, accordingly, the accuracy in forming the pattern can further be improved.

Example 5

Example 5 of the present invention will now be described.

First, a chemical-amplification-type resist film 2 similar to Example 4 was formed on the semiconductor substrate 1 to have a thickness of 0.5 μm, and then a resist coating film 9 that generates acid therein when irradiated with light or radial rays was applied to the chemical-amplification-type resist film 2 to have a thickness of 0.1 μm, the resist coating film 9 being composed of 90 parts by weight of polyvinyl alcohol and 10 parts by weight of triphenylsulfonium hexafluoroantimonate. Then, electron beams were applied with the accelerated voltage of about 20 KeV, followed by heating the semiconductor substrate 1 at about 100° C. for two minutes on a hot plate. Then, the resist coating film 9 was removed with pure water, and then development was performed for about 70 seconds with 2.38% tetramethylammonium hydroxide water solution.

As a result of Example 5, the resist film 2 had a sensitivity of 1.2 μC/cm$^2$ and a 0.2 μm line-and-space pattern exhibiting an excellent shape was formed when the resist film 2 was irradiated with electron beams of 2.0 μC/cm$^2$. When the evaluation was made by changing the time from the irradiation with the electron beams to performing the heating process to 20 hours, no sensitivity change was observed similar to Example 3.

Another experiment was performed, similar to Example 3, in such a manner that a resist coating film 9 composed of only polyvinyl alcohol in place of 90 parts by weight of polyvinyl alcohol and 10 parts by weight of para-toluenesulfonic acid was formed on the resist film 2. As a result, when the pattern was formed with heat applied immediately after the irradiation with the electron beams, the sensitivity and the resolution were not changed. If the time taken from the electron beam irradiation to performing the heating process was longer than 12 hours, the sensitivity gradually fell, resulting in a fall of the sensitivity to 4.5 μC/cm$^2$ after 20 hours had passed.

The material of the second compound that generates acid when irradiated with light or radial rays may be bonded to a portion of a high polymer which is a compound binder that generates acid when irradiated with light or radial rays or may be, together with the high polymer serving as the binder, present in the compound.

In the case where the second compound that generates acid when it is irradiated with light or radial rays is mixed together with the high polymer serving as the binder, the high polymer compound serving as the binder is exemplified by: starch such as polyvinyl alcohol, polyvinyl pyrolidone or cellulose; a water soluble high polymer such as polyethylene glycol, gelatin, polyacrylic acid, polymethacrylic acid, polymaleic acid or polyacrylic amide or their derivatives; and an organic-solvent soluble polymer such as methacrylic acid ester, acrylic acid ester, styrene, polycarbonate or polyester or their derivatives.

The second compound that is mixed with the foregoing materials and that generates acid when it is irradiated with light or radial rays is exemplified by: onium salts such as triphenylsulfonium tetrafluoroborate, triphenylsulfonium hexafluoroantimonate, triphenylsulfonium hexafluoroarsenate, triphenylsulfonium hexafluorophosphate, triphenylsulfonium trifluorosulfonate, 4-thiophenoxydiphenylsufonium tetrafluoroborate, 4-thiophenoxydiphenylsulfonium hexafluoroantimonate, 4-thiophenoxydiphenylsulfonium hexafluoroarsenate, 4-thiophenoxydiphenylsulfonium hexafluorophosphate, 4-thiophenoxydiphenylsulfonium trifluorosulfonate, 4-tert-butylphenyldiphenylsulfonium tetrafluoroborate, 4-tert-butylphenyldiphenylsulfonium hexafluoroantimonate, 4-tert-butylphenyldiphenylsulfonium hexafluoroarsenate, 4-tert-butylphenyldiphenylsulfonium hexafluorophosphate, 4-tert-butylphenyldiphenylsulfonium trifluorosulfonate, tris (4-methylphenyl) sulfonium tetrafluoroborate, tris (4-methylphenyl) sulfonium hexafluoroantimonate, tris (4-methylphenyl) sulfonium hexafluoroarsenate, tris (4-methylphenyl) sulfonium hexfluorophosphate, tris (4-methylphenyl) sulfonium trifluorosulfonate, tris (4-methoxyphenyl) sulfonium tetrafluoroborate, tris (4-methoxyphenyl) sulfonium hexafluoroantimonate, tris (4-methoxyphenyl) sulfonium hexafluoroarsenate, tris (4-methoxyphenyl) sulfonium hexfluorophosphate, tris (4-methoxyphenyl) sulfonium trifluorosulfonate, diphenyliodonium tetrafluoroborate, diphenyliodonium hexafluoroantimonate, diphenyliodonium hexafluoroarsenate, diphenyliodonium hexfluorophosphate, diphenyliodonium trifluorosulfonate, 3,3'-dinitrodiphenyliodonium tetrafluoroborate, 3,3'-dinitrodiphenyliodonium hexafluoroantimonate, 3,3'-dinitrodiphenyliodonium hexafluoroarsenate, 3,3'-dinitrodiphenyliodonium hexfluorophosphate, 3,3'-dinitrodiphenyliodonium trifluorosulfonate, 4,4'-dimethyldiphenyliodonium tetrafluoroborate, 4,4'-dimethyldiphenyliodonium hexafluoroantimonate, 4,4'-dimethyldiphenyliodonium hexafluoroarsenate, 4,4'-dimethyldiphenyliodonium hexfluorophosphate, 4,4'-dimethyldiphenyliodonium trifluorosulfonate, 4,4'-ditert-butyldiphenyliodonium tetrafluoroborate, 4,4'-ditert-butyldiphenyliodonium hexafluoroantimonate, 4,4'-ditert-butyldiphenyliodonium hexafluoroarsenate, 4,4'-ditert-butyldiphenyliodonium hexfluorophosphate or 4,4'-ditert-butyldiphenyliodonium trifluorosulfonate; a compound containing halogen such as 2,4,6,-tris (trichloromethyl) triazine, 2-allyl-4,6-bis (trichloromethyl) triazine, a,a,a,-tribromomethylphenylsulfon, a,a,a,a',a',a',-hexachloroxylylene, 2,2-bis (3, 5-dibrome-4-hydroxyphenyl)-1,1,1,3,3,3-hexafluoropropane or 1,1,1-tris (3,5-dibromo-4-hydroxyphenyl) ethane; and sulfonic acid esters such as 2-nitrobenzyltosylate, 2,6-dinitrobenzyltosylate, 2,4-dinitrobenzyltosylate, 2-nitrobenzyltriphylite, 2,6-dinitrobenzyltriphylite, 2,4-dinitrobenzyltriphylite, methanesulfonic acid 2-nitrobenzyl ester, methanesulfonic acid 2,4-dinitrobenzylester, acetic acid 2-nitrobenzyl ester, acetic acid 2-nitro-α-methylbenzyl ester, p-nitrobenzyl-9,10-dimethoxyanthracene-2-sulfonate, 1,2,3-tris (methanesulfonyloxy) benzene, 1,2,3-tris (ethanesulfonyloxy) benzene or 1,2,3-tris (propanesulfonyloxy) benzene. The foregoing materials may be combined.

It is preferable that the content of the second compound that generates acid when it is irradiated with light or radial rays is 1 to 40 wt % of the high polymer compound which serves as the binder. If the content is smaller than the foregoing value, a desired effect cannot be obtained. If the content is larger than the foregoing value, a uniform film cannot easily be obtained. What is worse, if the pattern is intended to be obtained by applying ultraviolet rays, the light transmittance of the resist coating film 9 falls and, accordingly, the resolution of the resist film 2 will deteriorate.

The method for forming the resist coating film for use in the present invention is exemplified by a method having an arrangement that a compound of the aforesaid type that has the sulfonic acid group or the carboxylic acid group or the compound that generates acid when it is irradiated with light or radial rays is previously dissolved in a solvent and the solution thus prepared is, by a spin coating method or the like, applied to the surface of the resist film on which the pattern will be formed. A process for removing the solvent by performing a heating process after the foregoing application may be optionally added. It is preferable that the thickness of the resist coating film is 0.03 µm to 0.5 µm. If the thickness is 0.03 µm or less, desired characteristics cannot easily be obtained. If it is 0.5 µm or more, the resolution of the base resist material will deteriorate.

The solvent for use in the present invention may be any material which dissolves the foregoing compounds, which does not react with them and which is not mixed with the base resist film. The solvent may generally be a material selected from a group consisting of methyl cellosolve, ethyl cellosolve, butyl cellosolve, methyl cellosolve acetate, ethyl cellosolve acetate, butyl cellosolve acetate, methoxymethyl propyonate, ethoxymethyl propyonate, ethoxyethyl propyonate, methoxypropyl acetate, ethoxypropyl acetate, diglyme, dimethylglyme, diethylglyme, cyclopentanone, cyclohexanone, γ-butylolactone, butyl acetate, isoamyl acetate, chlorobenzene, methylamiketone, propylene glycol monomethyl ether acetate, propylene glycol monoethylether acetate, ethanol, methanol, isopropanol, n-alkane, dichloroethane, trichloroethane, trichloroethylene and pure water. It is preferable that the fusing point of the selected material ranges from 70° C. to 220° C. If the fusing point is lower than the foregoing level, unevenness easily takes place. If the fusing point is higher than the foregoing level, the solvent cannot easily be dried.

The material of the resist coating film may include the compound having the sulfonic acid group or the carboxylic acid or the compound that generates acid when it is irradiated with light or radial rays. In order to improve the contact with the resist and application facility, an adhesion enhancing agent, an interfacial active agent and a compound for other purposes may be added if necessary.

There is a fear that the resist coating film 9 is mixed with the resist film 2 depending upon the characteristics of the resist film 2 for use as the base. In order to prevent this, it is necessary to form previously, on the resist film 2, an organic film (omitted from illustration), which is not mixed with the resist film 2, and then the resist coating film 9 for use in the present invention is formed. The material for forming the organic film serving as the foregoing intermediate layer may be any material that does not react with the compositions in the base resist film 2 and the resist coating film 9 for use in the present invention. It is exemplified by starch such as polyvinyl alcohol, polyvinyl pyrolidone or cellulose; a water soluble high polymer such as polyethylene glycol or polyacrylic acid; and an organic-solvent soluble polymer such as methacrylic acid ester, acrylic acid ester, styrene, polycarbonate, polyester, polyvinyl phenol or novolak resin or their derivatives.

Example 6

Example 6 of the present invention will now be described.

First, a 3-component-type chemical-amplification-type resist film 2 was formed on the semiconductor substrate 1 by a spin coating method to have a thickness of about 1 µm, the 3-component-type chemical-amplification-type resist film 2 being composed of a polymer in which a portion of the hydroxy group of polyvinyl phenol is substituted by a tertiary-butoxy carbonyl group, tertiary-butoxycarbonyl ester of bisphenol A and triphenyl sulfonium triphylite. Then, a resist coating film 9 formed by adding 10 parts by weight of triphenyl sulfonium trifluorosulfonate to 90 parts by weight of polyvinyl phenol was intended to be formed, resulting in mixing with the resist film 2. Accordingly, a polyacrylic acid film to serve as the organic film was formed on the resist film 2, and then the resist film 9 was formed to have a thickness of 0.10 µm. Then, KrF excimer laser beams were applied while interposing a mask pattern, followed by removing the resist coating film 9 and the organic film made of polyacrylic acid with a 2.38% tetramethylammonium hydroxide water solution. Then, a heating process was performed at 80° C. for 90 second by using a hot plate. Then, development was performed for 60 seconds by using a 2.38% tetramethyl ammonium hydroxide water solution.

As a result of Example 6, the resist film 2 had a sensitivity of 15 mJ/cm$^2$ and a 0.3 µm line-and-space pattern exhibiting an excellent shape was formed when the resist film 2 was irradiated with electron beams of 27 mJ/cm$^2$. When the evaluation was made by changing the time from the step of irradiation with the electron beams to performing the heating process to 10 hours, no sensitivity change was observed similar to Example 2.

It can be understood that, if there is the fear that mixing takes place between the material of the resist coating film 9 to be applied to the upper surface of the resist film 2 and the resist film 2, the foregoing problem can be overcome by forming the intermediate layer made of the organic film as employed in Example 6.

Table 2 shows results of experiments for evaluating the sensitivity and the resolution performed by changing the material and conditions for forming the resist film 2, the resist coating film 9 and the organic film forming the intermediate layer. In any case, a fine pattern having an excellent shape was resolved, and no sensitivity change was observed even if a long time was taken from the irradiation with light or radial rays to performing the heating process.

TABLE 2

| No | Material of Coating Film | Material of Organic Film | Material of Resist Film | Exposure Light Source | Sensitivity | Resolution |
|---|---|---|---|---|---|---|
| 1 | Polyacrylic acid + diethylamino benzene diazonium hexafluoro phosphate (9:1) | Not Provided | Poly-tert-butoxy carbonyloxystyrene + triphenylsulfonium hexafluoroantimonate | Excimer Laser | 15 mJ/cm$^2$ | 0.30 µm |

TABLE 2-continued

| No | Material of Coating Film | Material of Organic Film | Material of Resist Film | Exposure Light Source | Sensitivity | Resolution |
|---|---|---|---|---|---|---|
| 2 | Polyvinyl pyrolidone + tetrabrome bisphenol (9:1) | Not Provided | Poly-tert-butoxy carbonyloxystyrene + triphenylsulfonium hexafluoroantimonate | Excimer Laser | 17 mJ/cm$^2$ | 0.30 μm |
| 3 | Polyvinyl phenol + di-tert-butyl diphenyliodonium triphylite (85:15) | Polyacrylic acid | Poly-tert-butoxy carbonyloxystyrene + triphenylsulfonium hexafluoroantimonate | Excimer | 30 mJ/cm$^2$ | 0.30 / μm |
| 4 | Novolak resin + 1,2,3-trismethane sulfonyloxy benzene (8:2) | Alginic acid | Poly-tert-butoxy carbonyloxystyrene + triphenylsulfonium hexafluoroantimonate | Excimer Laser | 15 mJ/cm$^2$ | 0.30 μm |
| 5 | Polyacrylic acid + diethyl aminobenzene diazonium hexaphloro phosphate (9:1) | Not Provided | Poly-tert-butoxy carbonyloxystyrene + triphenylsulfonium hexafluoroantimonate | Electron Beam | 8.0 μc/cm$^2$ | 0.20 μm |
| 6 | Polylvinyl pyrolidone + tetrabromo bisphenol A (9:1) | Not Provided | Poly-tert-butoxy carbonyloxystyrene + triphenylsulfonium hexafluoroantimonate | Electron Beam | 2.5 μc/cm$^2$ | 0.20 μm |
| 7 | Polyvinyl phenol + di-tert-butyl diphenyiodonium triphylite (85:15) | Polyacrylic acid | Poly-tert-butoxy carbonyloxystyrene + triphenylsulfonium hexafluoroantimonate | Electron Beam | 2.2 μc/cm$^2$ | 0.20 μm |

As described above, according to the present invention, the resist coating film is formed on the chemical-amplification-type resist film so that a decrease in the concentration of the acid in the surface of the resist film is prevented after exposure has been performed. In particular, use of the resist coating film that contains a compound having a sulfonic acid group or a carbonic acid group enables the sulfonic acid or the carbonic acid to be supplied to the base resist film so that a decrease in the concentration of the acid is further effectively inhibited. When the resist coating film containing a compound that generates acid when it is irradiated with light or radial rays is used, acid is generated also in the resist coating film due to the exposure. The acid thus generated is supplied to the base resist film so that a decrease in the concentration of the acid in the surface of the resist film is inhibited further effectively. As a result, if a long time occurs from the exposure process to the ensuing heating process, a decrease in the concentration of the acid in the surface of the resist film can be inhibited. Therefore, the reactions to be taken in the heating process can be allowed to proceed effectively. Hence, a fine pattern having an excellent shape can be stably formed so that a reliable semiconductor apparatus exhibiting excellent patterning accuracy is obtained.

By determining the thickness of the resist coating film, the concentration of the sulfonic acid group or the carbonic acid group and the content of the compound that generates acid when it is irradiated with light or radial rays, desired characteristics can effectively be obtained.

By forming an organic film between the resist film and the resist coating film, the material that causes the resist film and the resist coating film to be mixed with each other can be used to obtain a similar effect if a proper material is selected to form the organic film.

What is claimed is:

1. A composite comprising:
   (i) a substrate;
   (ii) a chemical amplification resist film supported by the substrate of (i); and
   (iii) a resist coating film on a surface of the chemical amplification resist film of (ii), said resist coating film comprising at least one of
      (a) a high molecular weight polymeric binder and an acidic compound, dispersed in said polymeric binder and selected from the group consisting of benzoic acid, phthalic acid, benzene sulfonic acid, and toluene sulfonic acid, and
      (b) a high molecular weight polymeric binder and a compound, which, upon light irradiation, forms an acidic compound selected from the group consisting of benzoic acid, phthalic acid, benzene sulfonic acid, and toluene sulfonic acid, the compound being dispersed in the high molecular weight polymeric binder,
   wherein said resist coating film optionally further comprises at least one of
      (c) a high molecular weight polymer having a molecular weight (Mw) greater than 5000 and comprising an acidic group selected from the group consisting of a carboxylic acid group and a sulfonic acid group, and (d) a high molecular weight polymer having a molecular weight (Mw) greater than 5000 and comprising a group, which, upon light irradiation, forms an acidic group selected from the group consisting of a carboxylic acid group and a sulfonic acid group.

2. A composite comprising:
(i) a semiconductor substrate;
(ii) a chemical amplification resist film supported by the substrate of (i); and
(iii) a resist coating film on a surface of the chemical amplification resist film of (ii), said resist coating film comprising a high molecular weight polymeric binder and a compound, which, upon light irradiation, forms an acidic compound selected from the group consisting of onium salts, halogen-containing compounds, and sulfonic acid esters, the compound being dispersed in the high molecular weight polymeric binder,
wherein said resist coating film optionally further comprises at least one of
(c) a high molecular weight polymer having a molecular weight (Mw) greater than 5000 and comprising an acidic group selected from the group consisting of a carboxylic acid group and a sulfonic acid group, and
(d) a high molecular weight polymer having a molecular weight (Mw) greater than 5000 and comprising a group, which, upon light irradiation, forms an acidic group selected from the group consisting of a carboxylic acid group and a sulfonic acid group.

3. A composite comprising:
(i) a semiconductor substrate;
(ii) a chemical amplification resist film supported by the substrate of (i); and
(iii) a resist coating film on a surface of the chemical amplification resist film of (ii), said resist coating film comprising a high molecular weight polymeric binder and a compound, which, upon light irradiation, forms an acidic compound selected from the group consisting of diphenyliodionium trifluorosulfonate, triphenylsulfonium hexafluoroantimonate, and triphenylsulfonium trifluorosulfonate, the compound being dispersed in the high molecular weight binder,
wherein said resist coating film optionally further comprises at least one of
(c) a high molecular weight polymer having a molecular weight (Mw) greater than 5000 and comprising an acidic group selected from the group consisting of a carboxylic acid group and a sulfonic acid group, and
(d) a high molecular weight polymer having a molecular weight (Mw) greater than 5000 and comprising a group, which, upon light irradiation, forms an acidic group selected from the group consisting of a carboxylic acid group and a sulfonic acid group.

4. A composite comprising:
(i) a substrate;
(ii) a chemical amplification resist film supported by the substrate of (i);
(iii) a film of an organic material formed on a surface of the chemical amplification resist film of (ii); and
(iv) a resist coating film on a surface of the film of organic material of (iii), opposite a surface on which is formed the chemical amplification resist film of (ii), and which comprises at least one of
(a) a high molecular weight polymeric binder and para-toluene sulfonic acid, dispersed in said polymeric binder, and
(b) a high molecular weight polymeric binder and a compound, which, upon light irradiation, forms para-toluene sulfonic acid, the compound being dispersed in the high molecular weight polymeric binder,
wherein said film of organic material of (iii) is reactive with and prevents reaction between said chemical amplification resist film of (ii) and said resist coating film of (iv), and
said resist coating film optionally further comprises at least one of
(c) a high molecular weight polymer having a molecular weight (Mw) greater than 5000 and comprising an acidic group selected from the group consisting of a carboxylic acid group and a sulfonic acid group, and
(d) a high molecular weight polymer having a molecular weight (Mw) greater than 5000 and comprising a group, which, upon light irradiation, forms an acidic group selected from the group consisting of a carboxylic acid group and a sulfonic acid group.

5. A composite comprising:
(i) a substrate;
(ii) a chemical amplification resist film supported by a surface of the substrate of (i);
(iii) a thin film of an organic material on a surface of the chemical amplification resist film of (ii); and
(iv) a resist coating film, on a surface of the film of organic material of (iii), opposite a surface on which is formed the chemical amplification resist film of (ii), and which comprises at least one of
(a) a polymeric material comprising an acidic group selected from the group consisting of a carboxylic acid group and a sulfonic acid group,
(b) a polymeric material selected from the group consisting of poly(2-acrylamide-2-methylpropane sulfonic acid) and poly(3-butanesulfonic acid thiophene),
(c) a polymeric material and an acidic compound comprising an acidic group selected from the group consisting of a carboxylic acid group and a sulfonic acid group, and
(d) a polymeric material and a compound, which, upon light irradiation, forms an acidic compound comprising a group selected from the group consisting of a carboxylic acid group and a sulfonic acid group,
wherein said film of organic material of (iii) prevents reaction between said chemical amplification resist film of (ii) and said resist coating film of (iv).

* * * * *